(12) United States Patent
Nagahara (10) Patent No.: US 10,951,004 B2
(45) Date of Patent: Mar. 16, 2021

(54) LIGHT SOURCE DEVICE

(71) Applicant: Nichia Corporation, Anan (JP)

(72) Inventor: Seiji Nagahara, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/439,468

(22) Filed: Jun. 12, 2019

(65) Prior Publication Data

US 2019/0386455 A1  Dec. 19, 2019

(30) Foreign Application Priority Data

Jun. 13, 2018 (JP) ............................. JP2018-112836

(51) Int. Cl.
| | | |
|---|---|---|
| *H01S 5/022* | (2006.01) | |
| *H01S 5/40* | (2006.01) | |
| *H01S 5/068* | (2006.01) | |
| *H01S 5/024* | (2006.01) | |

(52) U.S. Cl.
CPC .......... *H01S 5/02236* (2013.01); *H01S 5/024* (2013.01); *H01S 5/06817* (2013.01); *H01S 5/4087* (2013.01)

(58) Field of Classification Search
CPC ...... H01S 5/4025–426; H01S 5/02476–02492; H01S 5/02236–02276; H01S 5/4093
See application file for complete search history.

(56) References Cited

U.S. PATENT DOCUMENTS

| | | | | |
|---|---|---|---|---|
| 6,621,839 | B1* | 9/2003 | Schroeder | H01S 5/0226 |
| | | | | 372/36 |
| 9,450,377 | B1* | 9/2016 | Roff | H01S 5/005 |
| 2001/0048698 | A1* | 12/2001 | Lorenzen | H01S 5/4025 |
| | | | | 372/36 |
| 2002/0110335 | A1* | 8/2002 | Wagner | G02B 6/422 |
| | | | | 385/89 |
| 2002/0131731 | A1* | 9/2002 | Ikeda | H01S 5/02248 |
| | | | | 385/92 |
| 2007/0091976 | A1* | 4/2007 | Ray | G02B 6/4249 |
| | | | | 372/107 |
| 2007/0217471 | A1* | 9/2007 | DeFranza | H01S 5/02469 |
| | | | | 372/50.12 |
| 2008/0192206 | A1* | 8/2008 | Takagi | G09G 3/02 |
| | | | | 353/28 |

(Continued)

FOREIGN PATENT DOCUMENTS

| | | | |
|---|---|---|---|
| JP | 2004-144794 A | | 5/2004 |
| JP | 2013-191787 A | | 9/2013 |

(Continued)

*Primary Examiner* — Joshua King
(74) *Attorney, Agent, or Firm* — Birch, Stewart, Kolasch & Birch, LLP (57) ABSTRACT

A light source device includes a substrate and a plurality of laser light sources. The laser light sources each include a submount mounted on the substrate, and a semiconductor laser element mounted on the submount. The laser light sources are individually and independently disposed on the substrate. The laser light sources disposed adjacent to each other and emitting light having an identical wavelength band differ from each other in thermal resistance at a region between the semiconductor laser element and the substrate.

17 Claims, 4 Drawing Sheets

(56) References Cited

U.S. PATENT DOCUMENTS

| | | | |
|---|---|---|---|
| 2009/0104727 A1* | 4/2009 | Krejci | H01S 5/4031 |
| | | | 438/46 |
| 2011/0007762 A1* | 1/2011 | Fukuda | H01S 5/02236 |
| | | | 372/36 |
| 2013/0243019 A1* | 9/2013 | Wakabayashi | H01S 5/02476 |
| | | | 372/36 |
| 2016/0099543 A1* | 4/2016 | Kuramoto | H01S 5/0224 |
| | | | 372/36 |
| 2016/0254639 A1 | 9/2016 | Watanabe | |
| 2016/0315447 A1* | 10/2016 | Gronenborn | H01S 5/02476 |
| 2018/0278019 A1* | 9/2018 | Yamauchi | H01S 5/068 |

FOREIGN PATENT DOCUMENTS

| | | |
|---|---|---|
| JP | 2015-088682 A | 5/2015 |
| WO | WO 2015/063973 A1 | 5/2015 |

* cited by examiner

LIGHT SOURCE DEVICE

CROSS-REFERENCE TO RELATED APPLICATION

This application claims priority to Japanese Patent Application No. 2018-112836, filed on Jun. 13, 2018, the disclosure of which is hereby incorporated by reference in its entirety.

BACKGROUND

The present disclosure relates to a light source device including a semiconductor laser.

Light source devices in which a semiconductor laser is employed are used in various industrial fields. Among them, there is a light source device in which a plurality of semiconductor laser elements emitting light of an identical wavelength band. In relation to that type of light source devices, what is proposed is a light source device including: a semiconductor laser array formed of a plurality of semiconductor laser elements arranged laterally in line and integrally formed; and a heat sink in contact with the lower surface of the semiconductor laser array. The heat sink is formed using different materials at the central region and the end regions in the lateral direction of the semiconductor laser array (for example, see WO 2015/063973).

In the light source device disclosed in WO 2015/063973, the heat dissipation efficiency becomes uneven in the lateral direction of the semiconductor laser array. This can widen the wavelength width of the semiconductor laser element, to thereby reduce the speckle noise. With such light source device, the speckle noise is reduced by only changing the material of the heat sink at the central region and the end regions of the semiconductor laser array. Thus, adjacent semiconductor laser elements are in contact with the region of the heat sink formed of an identical material except for the region formed of the different material. As a result, there is not much difference in the heat dissipation efficiency of most of the semiconductor laser elements adjacent to one another and in the wavelength of emitted light, failing to sufficiently reduce the speckle noise.

The present disclosure has been made in view of the foregoing, and is intended to provide a light source device with reduced speckle noise.

SUMMARY

A light source device according to one aspect of the present disclosure includes a substrate and a plurality of laser light sources. The laser light sources each include a submount mounted on the substrate, and a semiconductor laser element mounted on the submount. The laser light sources are individually and independently disposed on the substrate. The laser light sources disposed adjacent to each other and emitting light having an identical wavelength band differ from each other in thermal resistance at a region between the semiconductor laser element and the substrate.

As described above, the present disclosure can provide a light source device with reduced speckle noise.

DETAILED DESCRIPTION OF EMBODIMENTS

With reference to the drawings, a description will be given of embodiments or examples for carrying out the present disclosure as follows. Note that, the light source device described in the following is for embodying the technical idea of the present disclosure. Unless otherwise specified, the present disclosure is not limited to the following.

Throughout the drawings, those members having the identical function may be denoted by an identical reference character. For the sake of easier explanation or understanding, the description may be separately given for embodiments or examples. Here, the structures shown in separate embodiments or examples may be partially replaced or combined. In the embodiments or examples given in the following, a repetitive description as to previously described matters may be omitted, and just the differences are described. In particular, similar operation and effect achieved by a similar configuration will not be mentioned every embodiment or example. The size or positional relationship of the members shown in the drawings may be exaggerated for the sake of clarity.

Light Source Device According to First Embodiment

Figure 1:
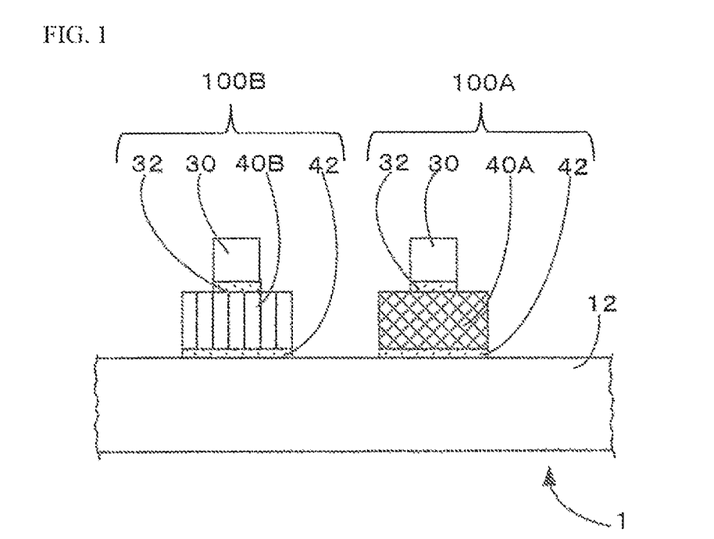
FIG. 1 is a lateral side view schematically showing part of the light source device according to a first embodiment of the present disclosure.

With reference to FIG. 1, a description will be given of a light source device according to a first embodiment of the present disclosure. FIG. 1 is a lateral side view schematically showing part of the light source device according to the first embodiment of the present disclosure.

A light source device 1 according to the present embodiment includes a substrate 12, and laser light sources 100 (specifically, 100A, 100B) which includes submounts 40 (specifically, 40A, 40B) mounted on the substrate 12 and semiconductor laser elements 30 mounted on the submounts 40 (40A, 40B). The plurality of laser light sources 100 (100A, 100B) is individually and independently disposed on the substrate 12. In particular, in the laser light sources 100A, 100B includes the semiconductor laser elements 30 disposed adjacent to each other and each emitting light having an identical wavelength band. The laser light sources 100A, 100B differ from each other in thermal resistance between the semiconductor laser element 30 and the substrate 12 in each of the laser light sources.

FIG. 1 shows one region in the light source device 1 where two laser light sources 100A, 100B are disposed adjacent to each other. The laser light sources 100, 100B emit light having an identical wavelength band and differing from each other in thermal resistance at the region between the semiconductor laser element 30 and the substrate 12 in each of the laser light sources. In FIG. 1, the semiconductor laser elements 30 each emit laser light having an identical wavelength band in the direction perpendicular to the drawing's surface.

Details of the structure of the laser light sources 100A, 100B are as follows. The semiconductor laser elements 30 and the submounts 40A, 40B are bonded to each other with a metal bonding layer 32. The submounts 40A, 40B and the substrate 12 are bonded to each other with a metal bonding layer 42. The material of the metal bonding layers 32, 42 may be gold-tin (AuSn), gold (Au), silver (Ag), copper (Cu), solder, metal nanomaterials or the like.

The thermal resistance between the semiconductor laser element 30 and the substrate 12 includes not only the thermal resistance of the submounts 40A, 40B but also the thermal resistance of the metal bonding layers 32, 42. Here, it is difficult to largely change the thermal resistance of the metal bonding layers 32, 42 between the laser light sources 100A, 100B. In order to obtain different thermal resistance values between the semiconductor laser element 30 and the substrate 12, it is effective to set different thermal resistance values between the submounts 40A, 40B.

In order to obtain different thermal resistance values between the submounts 40A, 40B, in the first embodiment, different materials are used for the submount 40A of the laser light source 100A and the submount 40B of the laser light source 100B. Specifically, while ceramic is used for the material of the submounts 40A, 40B, aluminum nitride (AlN) is used for the material of the submount 40A, and silicon carbide (SiC) is used for the material of the submount 40B.

Silicon carbide (SiC) and aluminum nitride (AlN) are both high in thermal conductivity, and efficiently dissipate heat from the semiconductor laser element 30 toward the substrate 12. Between those above, silicon carbide (SiC) is higher in thermal conductivity than aluminum nitride (AlN). Hence, the laser light source 100A including the submount 40A has the greater thermal resistance than the thermal resistance of the laser light source 100B including the submount 40B at the region between the semiconductor laser element 30 and substrate 12 in each of the laser light sources.

In this manner, the laser light sources 100A, 100B disposed adjacent to each other and emitting light each having an identical wavelength band can have different thermal resistances from each other at the region between the semiconductor laser element 30 and the substrate 12 in each of the laser light sources. This can provide different heat dissipation, and the adjacent semiconductor laser elements 30 can have different junction temperature from each other. Thus, the adjacent laser light sources 100A, 100B can emit light each having emission wavelength different from each other, to thereby effectively reduce the speckle noise.

As described above, in the first embodiment of the present disclosure, the laser light sources 100A, 100B disposed adjacent to each other and each emitting light having an identical wavelength band being differing from each other in the material of the submounts. Thus the submounts 40A, 40B can have an identical shape while having different thermal resistance at the region between the semiconductor laser element 30 and the substrate 12 in each of the laser light sources. This can facilitate manufacturing the light source device 1 and optical designing while achieving manufacture at low cost and setting different thermal resistance in effective manner.

In the present embodiment, the semiconductor laser elements 30 may emit light having an appropriately determined wavelength from the ultraviolet range to the infrared range. So long as two laser light sources emitting light having an identical wavelength band and differing from each other in thermal resistance are disposed adjacent to each other, the light source device can emit light having a single wavelength band, or the light source device can emit light having a plurality of wavelength bands.

The material of the submount 40 is not required to be the above-described materials, and may be other ceramic material such as alumina ($Al_2O_3$), silicon nitride ($Si_3N_4$) and the like, silicon, resin or the like.

In the present embodiment, the material of the substrate 12 is formed of aluminum nitride (AlN). The material is not required to be it, and may be other ceramic material such as silicon carbide (SiC), alumina ($Al_2O_3$), or silicon nitride ($Si_3N_4$), a resin material, a monocrystal such as silicon, or a metal material having an insulating layer.

Light Source Device According to Second Embodiment

Figure 2:
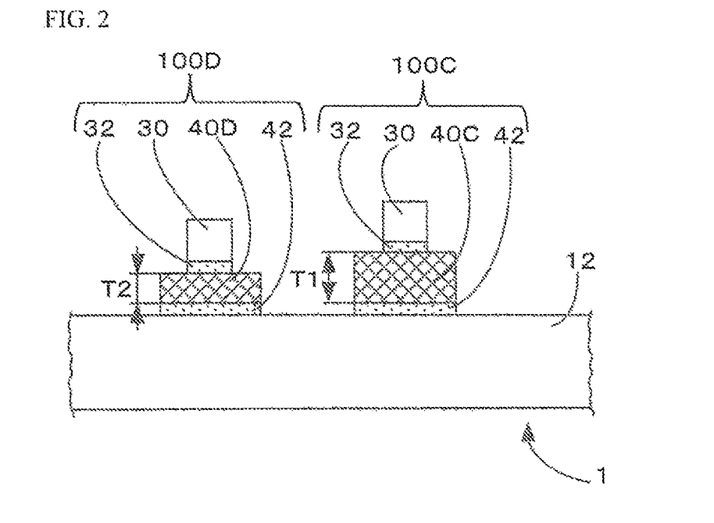
FIG. 2 is a lateral side view schematically showing part of a light source device according to a second embodiment of the present disclosure.

Next, with reference to FIG. 2, a description will be given of a light source device according to a second embodiment of the present disclosure. FIG. 2 is a lateral side view schematically showing part of the light source device according to the second embodiment of the present disclosure.

FIG. 2 shows one region in the light source device 1 where laser light sources 100C, 100D are disposed adjacent to each other. The laser light sources 100C, 100D emit light having an identical wavelength band and differing from each other in thermal resistance at the region between the semiconductor laser element 30 and the substrate 12 in each laser light sources. In FIG. 2, the semiconductor laser elements 30 individually emit laser light of an identical wavelength band in the direction perpendicular to the drawing's surface.

The laser light sources 100C, 100D according to the second embodiment disposed adjacent to each other and emitting light having an identical wavelength band are different from the first embodiment in that, submounts 40C, 40D have different thicknesses (i.e., height dimension) from each other, in order to obtain difference in thermal resistance at the region between the semiconductor laser element 30 and the substrate 12 in each laser light source. The submounts 40C, 40D are formed of an identical material.

In more detail, in the present embodiment, the submount 40C has a thickness T1 and the submount 40D has a thickness T2. The thickness T1 is greater than the thickness T2. Thus, the laser light source 100C including the submount 40C has greater thermal resistance than the thermal resistance of the laser light source 100D including the submount 40D at the region between the semiconductor laser element 30 and the substrate 12 in each laser light source.

In the present embodiment, adjusting the height(s) of the submounts 40C, 40D can securely adjust the difference in thermal resistance at the region between the semiconductor laser element 30 and the substrate 12 in each of the laser light sources 100C, 100D disposed adjacent to each other and emitting light having an identical wavelength band.

The rest of the configuration is basically identical to the first embodiment and, therefore, the description thereof will not be repeated.

Light Source Device According to Third Embodiment

Figure 3:
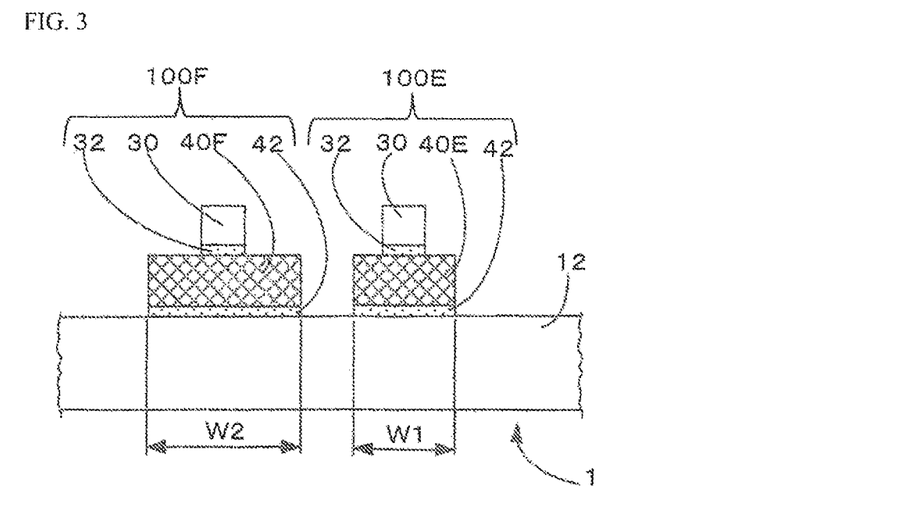
FIG. 3 is a lateral side view schematically showing part of a light source device according to a third embodiment of the present disclosure.

Next, with reference to FIG. 3, a description will be given of a light source device according to a third embodiment of the present disclosure. FIG. 3 is a lateral side view schematically showing part of the light source device according to the third embodiment of the present disclosure.

FIG. 3 shows one region in the light source device 1 where laser light sources 100E, 100F are disposed adjacent to each other. The laser light sources 100E, 100F emit light having an identical wavelength band and differing from each other in thermal resistance at the region between the semiconductor laser element 30 and the substrate 12. In FIG. 3, the semiconductor laser elements 30 individually emit laser light having an identical wavelength band in the direction perpendicular to the drawing's surface.

The laser light sources 100E, 100F according to the third embodiment disposed adjacent to each other and emitting light having an identical wavelength band are different from the first and second embodiments in that, a plane in a top view of each of the submounts 40E, 40F has surface area different from each other to obtain difference in thermal resistance at the region between the semiconductor laser element 30 and the substrate 12 in each laser light source. The submounts 40E, 40F are formed of an identical material.

In more detail, in the present embodiment, the submount 40E has a width W1 and the submount 40F has a width W2. The width W1 is smaller than the width W2. The submounts 40E, 40F have an identical dimension in the direction perpendicular to the width direction in a top view. The heat dissipating area of the submount 40E is smaller than the heat dissipating area of the submount 40F. Thus, the laser light source 100E including the submount 40E has greater the thermal resistance than the thermal resistance of the laser light source 100D including the submount 40F at the region between the semiconductor laser element 30 and the substrate 12 in each laser light source.

In the present embodiment, adjusting the surface area of a plane in a top view of each of the submounts 40E, 40F can securely adjust difference in the thermal resistance at the region between the semiconductor laser element 30 and the substrate 12 in each of the laser light sources 100E, 100F disposed adjacent to each other and emitting light having an identical wavelength band.

The rest of the configuration is basically identical to the first and second embodiments and, therefore, the description thereof will not be repeated.

As described above, in the light source device 1 according to the above-described embodiments, the laser light sources 100 differently dissipate heat by using difference of thermal resistance at the region between the semiconductor laser element 30 and the substrate 12 in each laser light source. Therefore the junction temperatures of the respective semiconductor laser elements 30 can be different from each other without the necessity of adding any other member. Thus, the adjacent laser light sources 100 emit light having wavelength different from each other, to effectively reduce the speckle noise. This can provide the light source device 1 with sufficiently reduced speckle noise.

The numerical value range of the difference in thermal resistance at the region between the semiconductor laser element 30 and the substrate 12 in each laser light source may be preferably 0.5° C./W or greater. This can securely reduce occurrence of the speckle noise.

When the laser light sources 100 disposed adjacent to each other emit light having different wavelengths, there is less need of taking into consideration of speckle noise occurrence. Therefore, in this case, the submounts 40 may be used which are identical to each other in thermal resistance at the region between the semiconductor laser element 30 and the substrate 12 in each laser light source.

FIGS. 1 to 3 show examples where two types of submounts 40 differing from each other in thermal resistance are used. Here, in the case where a greater number of laser light sources emitting light having an identical wavelength are disposed adjacent to each other, any number of the submounts 40 differing from one another in thermal resistance may be used. In this case, several types of submounts 40 differing from one another in thermal resistance can be used combining the first to third embodiments. Furthermore, differentiation in thermal resistance values may be applied not only to the submounts 40 but also to the metal bonding layers 32, 42.

Figure 4A:
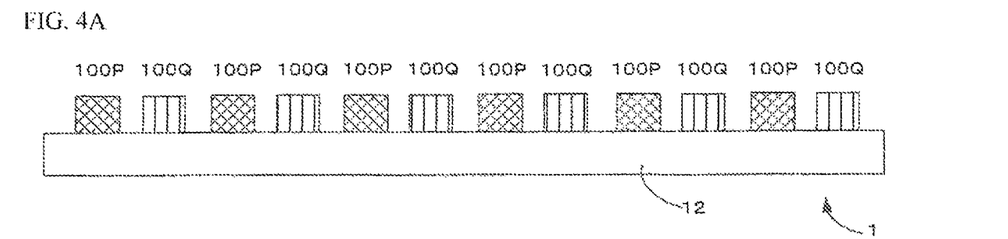
FIG. 4A is a lateral side view schematically showing an exemplary arrangement pattern of two types of laser light sources differing from each other in thermal resistance.
Figure 4B:
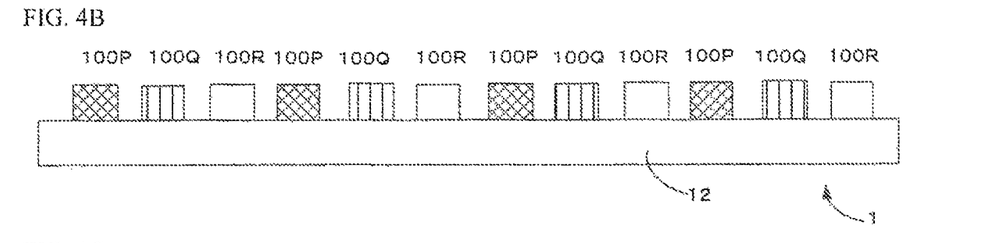
FIG. 4B is a lateral side view schematically showing an exemplary arrangement pattern of three types of laser light sources differing from one another in thermal resistance.
Figure 4C:
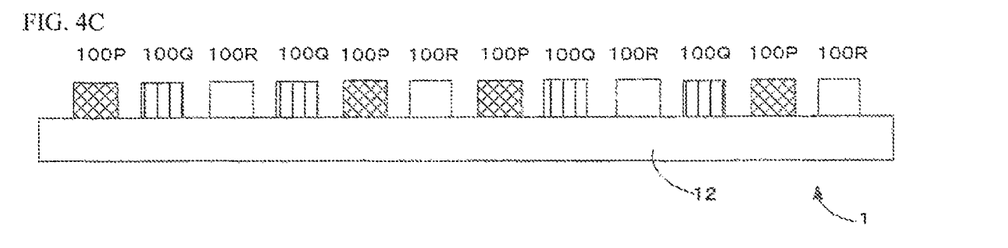
FIG. 4C is a lateral side view schematically showing other exemplary arrangement pattern of three types of laser light sources differing from one another in thermal resistance.

Arrangement Pattern of Laser Light Sources Differing from Each Other in Thermal Resistance Next, with reference to FIGS. 4A to 4C, a description will be given of arrangement patterns of several types of laser light sources differing from each other in thermal resistance at the region between the semiconductor laser element and the substrate in each laser light source. FIG. 4A is a lateral side view schematically showing an exemplary arrangement pattern of two types of laser light sources differing from each other in thermal resistance. FIG. 4B is a lateral side view schematically showing an exemplary arrangement pattern of three types of laser light sources differing from one another in thermal resistance. FIG. 4C is a lateral side view schematically showing other exemplary arrangement pattern of three types of laser light sources differing from one another in thermal resistance. All the arrangement patterns show the states where twelve pieces of laser light sources emitting light of an identical wavelength band are arranged adjacent to one another on the substrate 12. FIGS. 4A to 4C schematically show the laser light sources by quadrangles but not specifically showing the semiconductor laser elements and the submounts.

FIG. 4A exemplary shows two types of laser light sources 100P, 100Q alternately arranged, which are different from each other in thermal resistance at the region between the semiconductor laser element and the substrate 12 (i.e., in thermal resistance of the submount). Such an arrangement can effectively reduce the speckle noise with a relatively few types of the submounts.

FIG. 4B exemplary shows pattern of repeatedly arranged three types of laser light sources 100P, 100Q, 100R, which are different from one another in thermal resistance, in sequence from left to right in the drawing.

FIG. 4C exemplary shows three types of laser light sources 100P, 100Q, 100R, which is different from one another in thermal resistance, in an arrangement pattern of laser light sources 100P, 100Q, 100R in sequence from left to right in the drawing and those in an arrangement pattern of laser light sources 100Q, 100P, 100R in sequence from left to right in the drawing are alternately arranged from left to right in the drawing.

All the examples each show arrangement pattern in which two or more types of laser light sources differing from each other in thermal resistance at the region between the semiconductor laser element and the substrate in each laser light source (i.e., in thermal resistance of the submount) are disposed adjacent to each other, and such arrangement pattern is repeated. This can effectively reduce the speckle noise with a relatively few types of the submounts.

Furthermore, a repeated arrangement of two or more types of laser light sources differing from each other in thermal resistance can effectively reduce non-uniform color distribution attributed to wavelengths of lights emitted from the two or more types of light source.

The repeated arrangement pattern of two or more types of laser light sources differing in thermal resistance disposed adjacent to each other is not required to be the above-described examples, and is applicable to any appropriately selected arrangement pattern.

Light Source Device Including Collimating Lenses

Figure 5A:
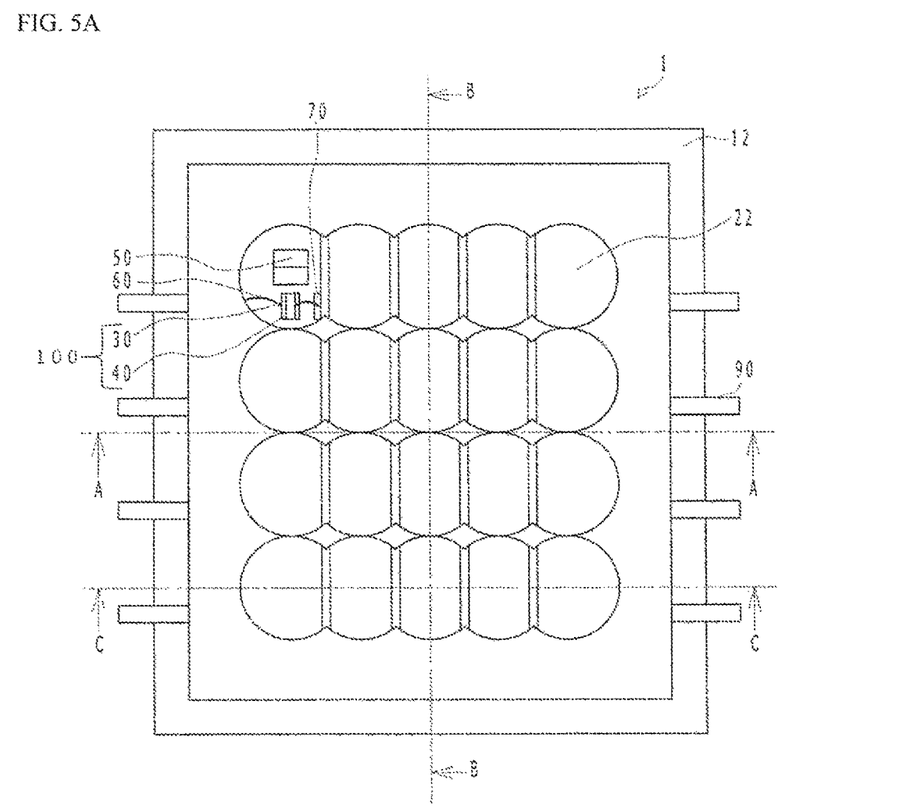
FIG. 5A is a plan view schematically showing an exemplary light source device including collimating lenses respectively corresponding to the laser light sources.
Figure 5B:
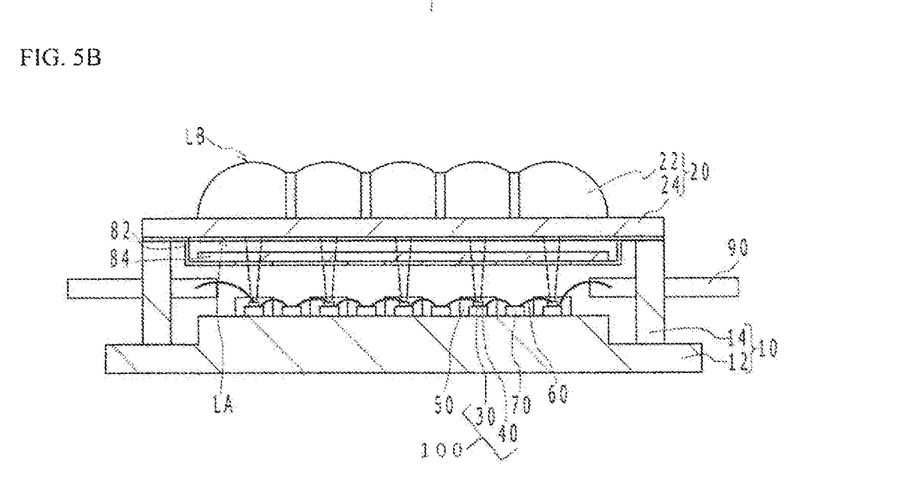
FIG. 5B is a cross-sectional view taken along line A-A in FIG. 5A.
Figure 5C:
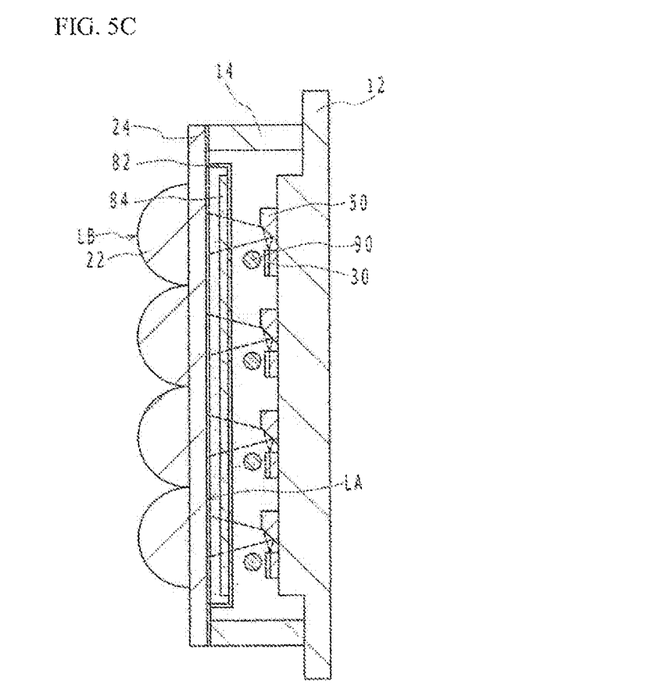
FIG. 5C is a cross-sectional view taken along line B-B in FIG. 5A.
Figure 5D:
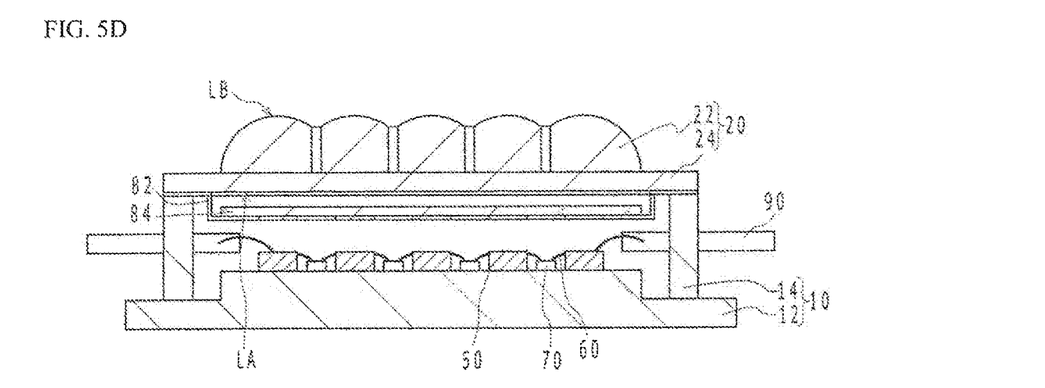
FIG. 5D is a cross-sectional view taken along line C-C in FIG. 5A.

Next, with reference to FIGS. 5A to 5D, a description will be given of an example of light source device including collimating lenses respectively corresponding to the laser light sources according to the embodiments. FIG. 5A is a plan view schematically showing an example of light source device including collimating lenses respectively corresponding to the laser light sources. FIG. 5B is a cross-sectional view taken along line A-A in FIG. 5A. FIG. 5C is a cross-sectional view taken along line B-B in FIG. 5A. FIG. 5D is a cross-sectional view taken along line C-C in FIG. 5A.

As shown in FIGS. 5A to 5D, the light source device 1 includes a package 10 configured with the substrate 12 and lateral walls 14, and a lens array 20 including a plurality of lens parts 22 arranged in a matrix. The lens array 20 is an integrally molded transparent glass member in which the plurality of lens parts 22 is connected with a connecting part 24. Under the lens array 20, a body 82 encapsulating the inner part of the package 10 and a light-transmissive member 84 are disposed.

On the substrate 12, the laser light sources 100 each including the semiconductor laser element 30 and the submount 40, and a plurality of mirrors 50 respectively corresponding to the laser light sources 100 are attached. Electrical power is supplied from the outside of the package 10 to each laser light sources 100 via leads 90, wirings 60, and relay members 70.

For ease of understanding, FIG. 5A shows the laser light source 100 and others including the semiconductor laser element 30 and the submount 40 disposed under the upper leftmost lens part 22 in the lens array 20 by seeing through the lens part 22.

The light source device 1 includes a plurality of laser light sources 100 emitting blue-color light, a plurality of laser light sources 100 emitting green-color light, and a plurality of laser light sources 100 emitting red-color light. In the laser light sources 100 disposed adjacent to each other and emitting light having an identical wavelength band (i.e., blue light, green light, or red light), thermal resistance at the region between the semiconductor laser element 30 and the substrate 12 is different in each of the laser light sources 100. In order to obtain such different thermal resistance values, any of the above-described embodiments may be applied.

The semiconductor laser elements 30 of the laser light sources 100 emit laser light in the lateral direction, and corresponding mirrors 50 reflect the light in the substantially perpendicular direction. The reflected light transmits through the light-transmissive member 84 to reach a light incident surface LA of the lens array 20. The light then transmits through the lens parts 22, and thus collimated light beams are emitted from a light exiting surface LB of the lens array 20. The collimated light beams emitted from the lens parts 22 of the lens array 20 are, for example, condensed by a condenser lens, and light beams of respective wavelengths are combined. This can provide white-color light with reduced speckle noise. Furthermore, in the present embodiment, the laser light sources 100 are individually and independently disposed, thus the collimating lenses (i.e., lens parts) 22 respectively corresponding to the laser light sources 100 are easily arranged.

The foregoing disclosure has describes the light source device 1 in which light from the laser light sources 100 is reflected in the substantially perpendicular direction by the mirrors 50. The present disclosure is not limited thereto, and includes the configuration in which light emitted in the lateral direction from the laser light sources 100 is emitted outside in the lateral direction from the light source device as it is without the reflection by the mirrors. Although the white-color light source has been described as above, the present disclosure is not limited thereto, and includes a light source device emitting light of a single wavelength in any wavelength range, or a light source device emitting light of a plurality of wavelengths in any wavelength ranges.

In the foregoing, the embodiments of the present disclosure have been described. The content of the disclosure may be changed as to details of the structure, and a combination of elements or any change in order of matters in the embodiments can be realized without deviating from the claimed scope and spirit of the present disclosure.

What is claimed is:

1. A light source device comprising:
   a substrate; and
   a plurality of laser light sources each including a submount mounted on the substrate, and a semiconductor laser element mounted on the submount, wherein
   the laser light sources are individually and independently disposed on the substrate, and
   the laser light sources disposed adjacent to each other and emitting light having an identical wavelength band differ from each other in thermal resistance at a region between the semiconductor laser element and the substrate,
   wherein
   the submounts include two or more types of submounts differing from each other in thermal resistance and disposed adjacent to each other, and
   the two or more types of submounts configure a repeating pattern or a plurality of arrangement patterns.

2. The light source device according to claim 1, wherein two types of the submounts differing from each other in thermal resistance are alternately arranged.

3. The light source device according to claim 1, further comprising collimating lenses respectively corresponding to the laser light sources.

4. The light source device according to claim 1, wherein the laser light sources include a plurality of laser light sources emitting blue light, a plurality of laser light sources emitting green light, and a plurality of laser light sources emitting red light.

5. The light source device according to claim 1,
   wherein the submounts differing from each other in thermal resistance each have a thickness different from each other.

6. The light source device according to claim 1,
   wherein the submounts differing from each other in thermal resistance each have a surface area different from each other as seen in a top view.

7. A light source device comprising:
a substrate; and
a plurality of laser light sources each including a submount mounted on the substrate, and a semiconductor laser element mounted on the submount, wherein
the laser light sources are individually and independently disposed on the substrate, and
the laser light sources disposed adjacent to each other and emitting light having an identical wavelength band differ from each other in thermal resistance at a region between the semiconductor laser element and the substrate,
wherein the submounts differing from each other in thermal resistance are each formed using a material different from each other.

8. The light source device according to claim 7, wherein the submounts include two or more types of submounts differing from each other in thermal resistance and disposed adjacent to each other, and
the two or more types of submounts configure a repeating pattern or a plurality of arrangement patterns.

9. The light source device according to claim 8,
wherein two types of the submounts differing from each other in thermal resistance are alternately arranged.

10. The light source device according to claim 7, further comprising collimating lenses respectively corresponding to the laser light sources.

11. The light source device according to claim 7, wherein the laser light sources include a plurality of laser light sources emitting blue light, a plurality of laser light sources emitting green light, and a plurality of laser light sources emitting red light.

12. A light source device comprising:
a substrate; and
a plurality of laser light sources each including a submount mounted on the substrate, and a semiconductor laser element mounted on the submount, wherein
the laser light sources are individually and independently disposed on the substrate, and
the laser light sources disposed adjacent to each other and emitting light having an identical wavelength band differ from each other in thermal resistance at a region between the semiconductor laser element and the substrate,
wherein the submounts differing from each other in thermal resistance each have a thickness different from each other.

13. The light source device according to claim 12, further comprising collimating lenses respectively corresponding to the laser light sources.

14. The light source device according to claim 12, wherein the laser light sources include a plurality of laser light sources emitting blue light, a plurality of laser light sources emitting green light, and a plurality of laser light sources emitting red light.

15. A light source device comprising:
a substrate; and
a plurality of laser light sources each including a submount mounted on the substrate, and a semiconductor laser element mounted on the submount, wherein
the laser light sources are individually and independently disposed on the substrate, and
the laser light sources disposed adjacent to each other and emitting light having an identical wavelength band differ from each other in thermal resistance at a region between the semiconductor laser element and the substrate,
wherein the submounts differing from each other in thermal resistance each have a surface area different from each other as seen in a top view.

16. The light source device according to claim 15, further comprising collimating lenses respectively corresponding to the laser light sources.

17. The light source device according to claim 15, wherein the laser light sources include a plurality of laser light sources emitting blue light, a plurality of laser light sources emitting green light, and a plurality of laser light sources emitting red light.

* * * * *